(12) United States Patent
Marks et al.

(10) Patent No.: US 8,236,680 B2
(45) Date of Patent: Aug. 7, 2012

(54) NANOSCALE, SPATIALLY-CONTROLLED GA DOPING OF UNDOPED TRANSPARENT CONDUCTING OXIDE FILMS

(75) Inventors: Tobin J. Marks, Evanston, IL (US);
Mark C. Hersam, Evanston, IL (US);
Norma E. S. Cortes, Croton-on-Hudson, NY (US)

(73) Assignee: Northwestern University, Evanston, IL (US)

( * ) Notice: Subject to any disclaimer, the term of this patent is extended or adjusted under 35 U.S.C. 154(b) by 483 days.

(21) Appl. No.: 12/488,931

(22) Filed: Jun. 22, 2009

(65) Prior Publication Data
US 2010/0230814 A1 Sep. 16, 2010

Related U.S. Application Data

(60) Provisional application No. 61/074,238, filed on Jun. 20, 2008.

(51) Int. Cl.
*H01L 21/44* (2006.01)
(52) U.S. Cl. .......... 438/608; 977/742; 977/762; 257/72; 257/613; 257/749; 438/609
(58) Field of Classification Search .................. 438/608, 438/609; 977/742, 762; 257/72, 613, 749
See application file for complete search history.

(56) References Cited

U.S. PATENT DOCUMENTS

| | | | | |
|---|---|---|---|---|
| 7,910,932 | B2 * | 3/2011 | Marks et al. ........ | 257/72 |
| 8,017,458 | B2 * | 9/2011 | Marks et al. ........ | 438/149 |
| 8,043,409 | B2 * | 10/2011 | Yukinobu ........ | 75/688 |
| 2008/0041446 | A1 * | 2/2008 | Wu et al. ........ | 136/263 |

OTHER PUBLICATIONS

Jimenez, V. M., et al., Interface effects for metal oxide thin films deposited on another metal oxide .2. SnO2 deposited on SiO2. Surface Science 1996, 366, (3), 545-555.
Hoflund, G. B., et al., Electron-Energy-Loss Study of the Oxidation of Polycrystalline Tin. Physical Review B 1992, 46, (11), 7110-7120.
Bevolo, A. J., et al., Leels and Auger Study of the Oxidation of Liquid and Solid Tin. Surface Science 1983, 134, (2), 499-528.
Fu, L. F., et al., Z-contrast and electron energy loss spectroscopy study of passive layer formation at ferroelectric PbTiO3/Pt interfaces. Applied Physics Letters 2005, 87, (26).
Li, Q., et al., Gong, X. G., Effects of Al addition on the native defects in hafnia. Applied Physics Letters 2006, 88, (18).
Lin, X. W., et al., Valence States and Hybridization in Vanadium-Oxide Systems Investigated by Transmission Electron-Energy-Loss Spectroscopy. Physical Review B 1993, 47, (7), 3477-3481.

(Continued)

*Primary Examiner* — Ori Nadav
(74) *Attorney, Agent, or Firm* — Morris, Manning & Martin, LLP; Tim Tingkang Xia, Esq.

(57) ABSTRACT

An article of manufacture comprising a nanowire and methods of making the same. In one embodiment, the nanowire includes a Ga-doped trace formed on a surface of an indium oxide layer having a thickness in nano-scale, and wherein the Ga-doped trace is formed with a dimension that has a depth is less than a quarter of the thickness of the indium oxide layer. In one embodiment, the indium oxide layer, which is optically transparent and electrically insulating, comprises an $In_2O_3$ film, and the thickness of the indium oxide layer is about 40 nm, and the depth of the nanowire is less than 10 nm.

9 Claims, 8 Drawing Sheets

OTHER PUBLICATIONS

Bach, D., et al., EELS investigations of different niobium oxide phases. Microscopy and Microanalysis 2006, 12, (5), 416-423.

Stemmer, S., et al., Characterization of oxygen-deficient SrCoO3-delta by electron energy-loss spectroscopy and Z-contrast imaging. Solid State Ionics 2000, 130, (1-2), 71-80.

Zhu, F. R., et al., Investigation of annealing effects on indium tin oxide thin films by electron energy loss spectroscopy. Thin Solid Films 2000, 359, (2), 244-250.

Morikawa, H., et al., On the grain boundary segregation of Sn in indium-tin-oxide thin films. Journal of Electron Microscopy 2000, 49, (1), 67-72.

Wang, X. F., et al., Effect of Al and Y incorporation on the structure of HfO2. Journal of Applied Physics 2008, 104, (093529), 1-4.

Zhang, H., et al., Transmission High-Energy Electron-Energy-Loss Spectrometry (EELS) Analysis of Hole Formation and Charge-Transfer in P-Type Doped Cuprate Superconductors. Journal of the American Ceramic Society 1993, 76, (5), 1143-1149.

Degroot, F. M. F., et al., Oxygen 1s X-Ray-Absorption Edges of Transition-Metal Oxides. Physical Review B 1989, 40, (8), 5715-5723.

Minami, T., Transparent and conductive multicomponent oxide films prepared by magnetron sputtering. Journal of Vacuum Science & Technology A-Vacuum Surfaces and Films 1999, 17, (4), 1765-1772.

Wang, A. C., et al., Growth, microstructure, charge transport and transparency of random polycrystalline and heteroepitaxial metalorganic chemical vapor deposition-derived gallium-indium-oxide thin films. Journal of Materials Research 2002, 17, (12), 3155-3162.

Phillips, J. M., et al., Transparent Conducting Thin-Films of GaInO3. Applied Physics Letters 1994, 65, (1), 115-117.

Bellingham, J. R.; Phillips, W. A.; Adkins, C. J., Electrical and Optical-Properties of Amorphous Indium Oxide. Journal of Physics-Condensed Matter 1990, 2, (28), 6207-6221.

Minami, T., New n-type transparent conducting oxides. Mrs. Bulletin 2000, 25, (8), 38-44.

Burstein, E., et al., Anomalous optical absorption limit in InSb. Physical Review 1953, 632-633.

Tanenbaum, M., et al., Optical properties of indium antimonide. Physical Review 1953, 91, (6), 1591-1592.

Gordon, R. G., Criteria for Choosing Transparent Conducting Oxides. MRS Bulletin 2000, (August), 52-27.

Weiner, R. L., et al., Optical Properties of Indium Oxide. Journal of Applied Physics 1966, 37, (1), 299-302.

Lewis, B. G., et al., Applications and Processing of Transparent Conducting Oxides. MRS Bulletin 2000, (August), 22-27.

Freeman, A. J., et al., Chemical and thin-film strategies for new transparent conducting oxides. MRS Bulletin 2000, 25, (8), 45-51.

Chaney, J. A., et al., Work function changes and surface chemistry of oxygen, hydrogen, and carbon on indium tin oxide. Applied Physics Letters 2001, 180, 214-226.

Christou, V., et al., High resolution x-ray photemission study of plasma oxidation of indium-tin-oxide films surfaces. Journal of Applied Physics 2000, 88, (9), 5180-5187.

Park, Y., et al., Work function of indium tin oxide transparent conductor measured by photoelectron spectroscopy. Applied Physics Letters 1996, 68, (19), 2699-2701.

Purvis, K. L., et al., Surface characterization and modification of indium tin oxide in ultrahigh vacuum. Journal of the American Chemical Society 2000, 122, 1808-1809.

Brewer, S. H., et al., Optical properties of indium oxide and fluorine-doped tin oxide surfaces: Correlation of reflectivity, skin depth, and plasmon frequency with conductivity. Journal of Alloys and Compounds 2002, 338, 73-79.

Fan, J. C., et al., X-ray photoemission spectroscopy studies of Sn-doped inidium-oxide films. Journal of Applied Physics 1977, 48, (8), 3524-3531.

Hamberg, I., et al., . Evaporated Sn-doped In2O3 films: Basic optical properties and applications to energy-efficient windows. Journal of Applied Physics 1986, 60, (11), R123-R159.

Nakao, T., et al., Characterization of indium tin oxide film and practical indium oxide film by electron microscopy. Thin Solid Films 2000, 370, 155-162.

Tahar, R., et al., Tin doped indium oxide thin films: Electrical properties. Journal of Applied Physics 1998, 83, (5), 2631-2645.

Behdani, M., et al., Submicron liquid crystal pixels on a nanopatterned indiun tin oxide surface. Applied Physics Letters 2002, 80, (24), 4635-4637.

Jin, S., et al., Dopant ion size and electronic structure effects on transparent conducting oxides. Sc-doped CdO thin films grown by MOCVD. Journal of the American Chemical Society 2004, 126, 13787-13793.

Chopra, K. L., et al., Transparent Conductors—a Status Review. Thin Solid Films 1983, 102, (1), 1-46.

Nomura, K, et al., Room-temperature fabrication of transparent flexible thin-film transistors using amorphous oxide semiconductors. Nature 2004, 432, (7016), 488-492.

Wang, L., et al., High-performance transparent inorganic-organic hybrid thin-film n-type transistors. Nature Materials 2006, 5, (11), 893-900.

Nomura, K., et al., Thin-film transistor fabricated in single-crystalline transparent oxide semiconductor. Science 2003, 300, (5623), 1269-1272.

Yavas, O., et al., High-speed maskless laser patterning of thin films for giant microelectronics. Japanese Journal of Applied Physics Part 1-Regular Papers Short Notes & Review Papers 1999, 38, (12B), 7131-7134.

Molloy, J., et al., The reactive ion etching of transparent electrodes for flat panel displays using Ar/Cl-2 plasmas. Journal of the Electrochemical Society 1995, 142, (12), 4285-4289.

Chen, M. F., et al., Laser direct write patterning technique of indium tin oxide film. Thin Solid Films 2007, 515, (24), 8515-8518.

Chae, J., et al., Patterning of indium tin oxide by projection photoablation and lift-off process for fabrication of flat-panel displays. Applied Physics Letters 2007, 90, (26).

Breen, T. L., et al., Patterning indium tin oxide and indium zinc oxide using microcontact printing and wet etching. Langmuir 2002, 18, (1), 194-197.

Catalan, A. B., et al., Formation of Patterned Tin Oxide Thin-Films by Ion-Beam Decomposition of Metalorganics. Thin Solid Films 1990, 188, (1), 21-26.

Hamdi, A. H., et al., Doping, Patterning and Analysis of Tin Oxide-Films Using Ion-Beams. Thin Solid Films 1991, 198, (1-2), 9-15.

Sosa, N. E., et al., Nanoscale Writing of Transparent Conducting Oxide Features with a Focused Ion Beam. Advanced Materials 2009, 21, (6), 721-725.

Bender, M., et al., Dependence of the photoreduction and oxidation behavior of indium oxide films on substrate temperature and film thickness. Journal of Applied Physics 2001, 90, (10), 5382-5387.

Marezio, M., Refinement of Crystal Structure of In2O3 at 2 Wavelengths. Acta Crystallographica 1966, 20, 723-&.

Lany, S., et al., Dopability, intrinsic conductivity, and nonstoichiometry of transparent conducting oxides. Physical Review Letters 2007, 98, (4).

Mryasov, O. N., et al., Electronic band structure of indium tin oxide and criteria for transparent conducting behavior. Physical Review B 2001, 64, (23).

Tanaka, I., et al., First-principles calculations of anion vacancies in oxides and nitrides. Journal of the American Ceramic Society 2002, 85, (1), 68-74.

Tomita, T., et al., The origin of n-type conductivity in undoped In2O3. Applied Physics Letters 2005, 87, (5).

Warschkow, O., et al., Mason, T. O., Defect structures of tin-doped indium oxide. Journal of the American Ceramic Society 2003, 86, (10), 1700-1706.

Ohya, Y., et al., Equilibrium dependence of the conductivity of pure and tin-doped indium oxide on oxygen partial pressure and formation of an intrinsic defect cluster. Journal of the American Ceramic Society 2008, 91, (1), 240-245.

Voyles, P. M., et al., Atomic-scale imaging of individual dopant atoms and clusters in highly n-type bulk Si. Nature 2002, 416, (6883), 826-829.

Klie, R. F., et al., High-resolution Z-contrast imaging and EELS study of functional oxide materials. Micron 2008, 39, (6), 723-733.

Muller, D. A., et al., Mapping Sp(2) and Sp(3) States of Carbon at Subnanometer Spatial-Resolution. Nature 1993, 366, (6457), 725-727.

Sigle, W., Analytical transmission electron microscopy. Annual Review of Materials Research 2005, 35, 239-314.

Cava, R. J., et al., GaInO3—a New Transparent Conducting Oxide. Applied Physics Letters 1994, 64, (16), 2071-2072.

Hwang, J. H., et al., Point defects and electrical properties of Sn-doped In-based transparent conducting oxides. Solid State Ionics 2000, 129, (1-4), 135-144.

Kim, J. H., et al., Effect of rapid thermal annealing on electrical and optical properties of Ga doped ZnO thin films prepared at room temperature. Journal of Applied Physics 2006, 100, (11).

Ma, T. Y., et al., Effects of rapid thermal annealing on the morphology and electrical properties of ZnO/In films. Thin Solid Films 2002, 410, (1-2), 8-13.

Weijtens, C. H. L., Influence of the Deposition and Anneal Temperature on the Electrical Properties of Indium Tin Oxide. Journal of Electrochemical Society 1991, 138, (11), 3432-3434.

Klie, R. F., et al., Atomic resolution STEM analysis of defects and interfaces in ceramic materials. Micron 2005, 36, (3), 219-231.

Browning, N. D., et al., Atomic-Resolution Chemical-Analysis Using a Scanning-Transmission Electron-Microscope. Nature 1993, 366, (6451), 143-146.

Mason, T. O., et al., Defect chemistry and physical properties of transparent conducting oxides in the CdO-In2O3-SnO2 system. Thin Solid Films 2002, 411, (1), 106-114.

Sheets, W. C., et al., Hydrothermal synthesis of delafossite-type oxides. Chemistry of Materials 2006, 18, (1), 7-20.

* cited by examiner

NANOSCALE, SPATIALLY-CONTROLLED GA DOPING OF UNDOPED TRANSPARENT CONDUCTING OXIDE FILMS

CROSS-REFERENCE TO RELATED PATENT APPLICATION

This application claims priority to and the benefit of, pursuant to 35 U.S.C. §119(e), U.S. provisional patent application Ser. No. 61/074,238, filed Jun. 20, 2008, entitled "NANOSCALE, SPATIALLY-CONTROLLED GA DOPING OF UNDOPED TRANSPARENT CONDUCTING OXIDE FILMS," by Tobin J. Marks, Mark C. Hersam and Norma E. Sosa, the contents of which is incorporated herein in its entirety by reference.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, superscript "n" represents the nth reference cited in the reference list. For example, [ ][29] represents the 29th reference cited in the reference list, namely, Sosa, N. E.; Liu, J.; Chen, C.; Marks, T. J.; Hersam, M. C., Nanoscale Writing of Transparent Conducting Oxide Features with a Focused Ion Beam. *Advanced Materials* 2009, 21, (6), 721-725.

STATEMENT OF FEDERALLY-SPONSORED RESEARCH

This invention was made with government support under Grant No. DMR-0520513 awarded by the National Science Foundation and grant No. W911NF-05-1-0177 awarded by the Army Research Office. The government has certain rrights in the invention.

FIELD OF THE INVENTION

The present invention relates generally to an article of manufacture comprising a nanowire, and more particularly to a nanowire that includes a Ga-doped trace formed on a surface of an indium oxide layer, which is optically transparent and electrically insulating, having a thickness in nano-scale, and methods of making the same.

BACKGROUND OF THE INVENTION

The use of transparent conducting oxides (TCOs) as the basis for all-transparent electronic components has been gaining considerable interest as they point to a pivotal change in both scientific and consumer electronics. The reason TCOs[1-3] will undoubtedly lead, or play a primary role, in this new exciting field is that, when degenerately doped, they exhibit near-metallic conductivities while maintaining bandgaps in the 3.6-3.8 eV[4]. Transparent conducting oxides were first discovered in 1907 by Badeker; he discovered that by oxidizing a Cd metal film during deposition, he could create a material that was both transparent and electrically conducting[5]. Yet, although CdO was the first TCO discovered, it is tin-doped indium oxide, commonly known as "ITO", that became the most widely used commercial TCO in optoelectronics. In the 1990s[6], research groups began developing multi-cation systems such as Gd-doped $InO_x$, F-doped $In_2O_3$[5]; and Al-, In-, B- Ga-doped $ZnO^{3, 5}$. Ternary systems also exist, which include (Zn—In—Ga)—O, (Ga—In—Sn)—O, and (Cd—In—Sn)—O[6]. There are many applications of TCOs that include their use as a transparent anode in optoelectronics[5, 7-10], as heat mirrors for solar collectors[11-13], as the antireflection coating and/or electrodes in photovoltaics[12, 14, 15], photodetectors[15], flat panel and crystal displays[16], de-icers, and IR reflective coatings for building windows that reduce heating and cooling costs[17, 18].

The possibility of truly realizing invisible electronics[19-21] seems to be eminent as transistor action within an all-TCO framework has already been achieved. Yet, in addition to transistors, transparent electronic circuits will require the development of transparent interconnects—at or near the nanoscale. To this end, patterning of TCO blanket films via chemical and physical means has been reported[22-26]. In particular, TCO patterning aiming to create transparent conducting wires has been shown with wet etching through a resist mask[26]. The advantages to user-defined patterns via large-scale, parallel processing are clear. Yet one distinct difficulty remains, namely insufficient control of the reaction due to its dependence on local microstructure, which limits the pattern resolution to a few hundred nanometers. Another example of attempts to create nanoscale wires in predetermined patterns, although not of TCOs, is the use of ion beams (e.g. $B^+$, $O^+$, $P^+$, or $As^+$ beams at $5 \times 10^{14}$-$10^{16}$ ions $cm^{-2}$ in the accelerating voltage range of 35-100 keV) to locally decompose metal-organic blanket thin films. This process has been shown to create 250 nm tall metallic structures with linewidths of ~330 nm[27, 28]. While this technique does achieve impressive structures (certainly with metallic conductivities) they are nonetheless not transparent, the effect of which would dominate when the necessary number of interconnect for viable electronics is considered. Thus it is evident that the need for TCO-based nanowires with precise positioning is necessary. To this end, the lithographic writing of nanoscale, optically transparent, electrically conducting wires that are embedded within a highly insulating undoped metal oxide host via focused ion beam (FIB) implantation was recently reported[29] by our group.

The fabrication of these TCO wires was evidenced with a combination of advanced atomic force microscopy (AFM) techniques and secondary ion mass spectrometry (SIMS) depth profiling. The wire dimensions achieved were $\leq 160$ nm wide and nominally 7 nm deep, with user-defined lengths. Equally important, state-of-the-art FIB processing implies full lithographic control which in turn leads to completely arbitrary shapes, and are theoretically limitless in length and connectivity (Sosa et al[29]). This doping technique—using a FIB beam to controllably implant Ga into undoped oxide host create patterns at the nanoscale—yields high contrast in electrical conductivity between doped and undoped material as evidenced in conductive AFM images, meanwhile achieving minimal damage to the surface (Sosa et. al.[29]).

Therefore, a heretofore unaddressed need exists in the art to address the aforementioned deficiencies and inadequacies.

SUMMARY OF THE INVENTION

In one aspect, the present invention relates to a method of fabricating a nanowire. In one embodiment, the method includes the steps of (a) positioning a substrate over a support structure such that a part of the substrate is not supported by the structure and is suspended over the support structure; (b) depositing a semiconductor oxide film over the substrate; (c) depositing an indium oxide film, which is optically transparent and electrically insulating, over the semiconductor oxide film; (d) depositing an anti-charging film over the indium oxide film such that a layered structure is formed with the anti-charging film as the top layer; (e) focusing and projecting a beam of Ga ions onto the anti-charging film over a region corresponding to the suspended part of the substrate to implant Ga ions into the indium oxide film along at least one trace; and (f) immediately removing the top layer from the layered structure after step (e) such that a surface of the indium oxide film with at least one Ga-doped trace is exposed to the outside, wherein the at least one Ga-doped trace is substantially formed along said at least one trace to form a nano-scaled wire.

In one embodiment, the substrate comprises a SiN membrane. The semiconductor oxide film comprises a Si oxide film. The indium oxide film comprises an $In_2O_3$ film. The anti-charging film comprises an Au film. The thickness of the anti-charging film is less than that of any of the substrate, the semiconductor oxide film, and the indium oxide film.

The step of focusing and projecting is performed with a dual beam FIB implantation with a beam of electrons simultaneously for imaging.

In one embodiment, prior to the step (f), the step (e) is repeated for a number of times until a desired pattern of a plurality of Ga ion traces is formed thereon the indium oxide film.

In another aspect, the present invention relates to a method of fabricating a nanowire. In one embodiment, the method includes the steps of (a) preparing a layered structure that has a substrate, an anti-charging layer and an indium oxide layer, which is optically transparent and electrically insulating, positioned between the anti-charging layer and the substrate; (b) positioning the layered structure over a support structure such that the substrate is in contact with the support structure but a part of the substrate is not supported by the structure and is suspended over the support structure; (c) focusing and projecting a beam of Ga ions onto the anti-charging layer of the layered structure over a region corresponding to the suspended part of the substrate to implant Ga ions into the indium oxide layer along at least one trace; and (d) immediately removing the top layer from the layered structure after step (c) such that a surface of the indium oxide layer with at least one Ga-doped trace is exposed to the outside, wherein the at least one Ga-doped trace is substantially formed along said at least one trace to form a nano-scaled wire.

In one embodiment, the substrate comprises a SiN membrane that is in contact with the support structure, and a semiconductor oxide film deposited over the SiN membrane. The semiconductor oxide film comprises a Si oxide film in one embodiment. The indium oxide layer comprises an $In_2O_3$ film. And the anti-charging layer comprises an Au film.

In one embodiment, the step of focusing and projecting is performed with a dual beam FIB implantation with a beam of electrons simultaneously for imaging.

In one embodiment, prior to the step (d), further comprising the step of repeating the step (c) a number of times until a desired pattern of a plurality of Ga ion traces is formed thereon the indium oxide layer.

In another aspect, the present invention relates to an article of manufacture comprising a nanowire. In one embodiment, the nanowire includes a Ga-doped trace formed on a surface of an indium oxide layer having a thickness in nano-scale, and wherein the Ga-doped trace is formed with a dimension that has a depth is less than a quarter of the thickness of the indium oxide layer.

In one embodiment, the thickness of the indium oxide layer is about 40 nm, and the depth of the nanowire is less than 10 nm.

In one embodiment, the indium oxide layer is deposited over a substrate, which, in one embodiment, has a SiN membrane and a semiconductor oxide film deposited over the SiN membrane.

In one embodiment, the semiconductor oxide film comprises a Si oxide film. And the indium oxide layer, which is optically transparent and electrically insulating, comprises an $In_2O_3$ film.

In another aspect, the present invention relates to an article of manufacture comprising a plurality of nanowires. In one embodiment, each of the nanowires includes a Ga-doped trace formed on a surface of an indium oxide layer having a thickness in nano-scale, and wherein the Ga-doped trace is formed with a dimension that has a depth is less than a quarter of the thickness of the indium oxide layer.

In one embodiment, the thickness of the indium oxide layer is about 40 nm, and the depth of the nanowire is less than 10 nm.

In one embodiment, the indium oxide layer is deposited over a substrate, which, in one embodiment, has a SiN membrane and a semiconductor oxide film deposited over the SiN membrane.

In one embodiment, the semiconductor oxide film comprises a Si oxide film. And the indium oxide layer, which is optically transparent and electrically insulating, comprises an $In_2O_3$ film.

In one embodiment, the plurality of nanowires are formed in a desired pattern thereon the indium oxide layer.

These and other aspects of the present invention will become apparent from the following description of the preferred embodiment taken in conjunction with the following drawings, although variations and modifications therein may be affected without departing from the spirit and scope of the novel concepts of the disclosure.

DETAILED DESCRIPTION OF THE INVENTION

Figure 1:
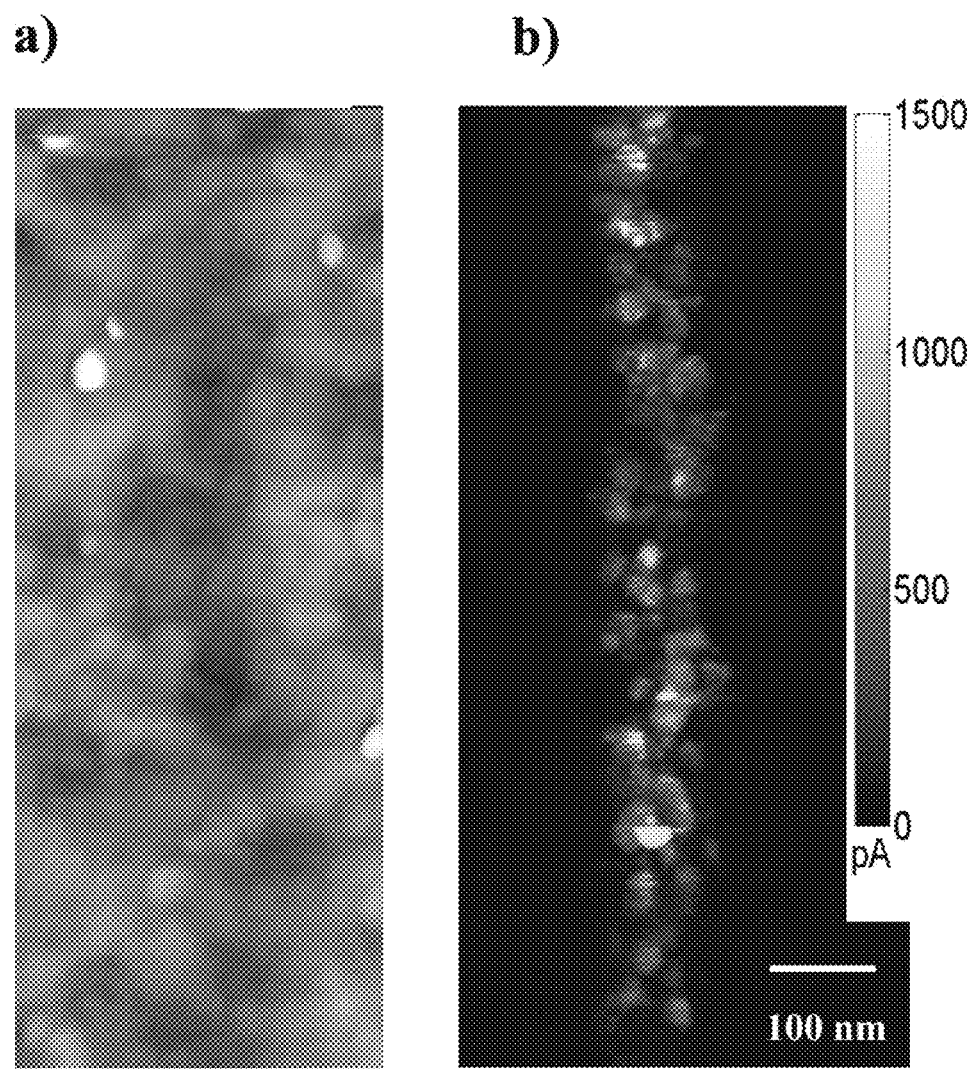
FIG. 1 shows cAFM image of a single FIB-doped nanowire according to one embodiment of the present invention: (a) Topography and (b) current map for a nanowire written with a dose of $\sim 9 \times 10^{16}$ ions cm$^{-2}$ using a 5 kV beam energy at 1.5 pA beam current. It can be noted that clusters of domain-like regions of higher conductance make up the nanowires created with the implantation. The electrically active width is about 100 nm on average.
Figure 2:
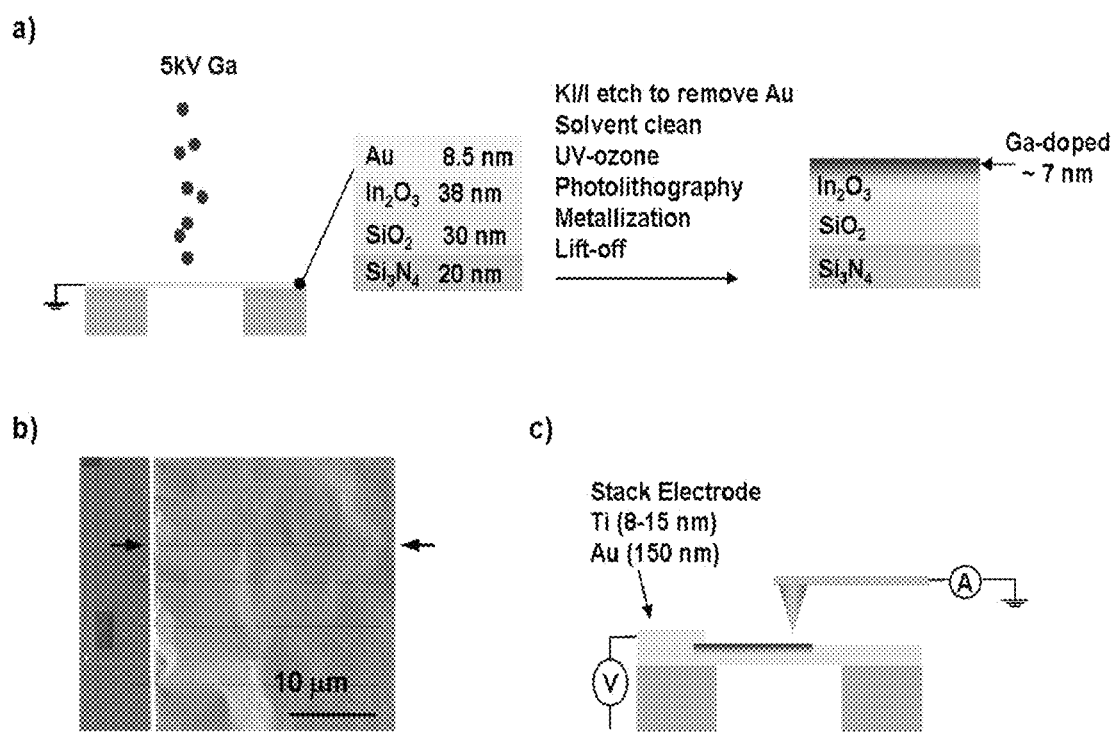
FIG. 2 shows schematically fabrication and characterization of nanowires according to one embodiment of the present invention: (a) FIB implantation directly onto ~96 nm thick suspended film (cross-section of membrane layers is shown) at 5 kV. Au anti-charging layer is removed immediately after fabrication. A cross-section schematic of the layered structure post-doping is shown on the right. (b) SEM image (top view) immediately after implantation showing FIB wires written at the edge of one window (arrows flank one wire). Although some film corrugation is observed, it does not inhibit AFM scanning or TEM imaging. (c) Schematic of the conductive AFM set-up for collection of current maps.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

Definitions

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, if any, the term "atomic force microscope (AFM)" or scanning force microscope (SFM) refers to a very high-resolution type of scanning probe microscope, with demonstrated resolution of fractions of a nanometer, more than 1000 times better than the optical diffraction limit. The term "microscope" in the name of "AFM" is actually a misnomer because it implies looking, while in fact the information is gathered or the action is taken by "feeling" the surface with a mechanical probe. The AFM in general has a microscale cantilever with a tip portion (probe) at its end that is used to scan the specimen surface. The cantilever is typically silicon or silicon nitride with a tip radius of curvature on the order of nanometers. When the tip is brought into proximity of a sample surface, forces between the tip and the sample lead to a deflection of the cantilever according to Hooke's law. The AFM can be utilized in a variety of applications.

As used herein, if any, the term "transmission electron microscopy (TEM)" refers to a microscopy technique whereby a beam of electrons is transmitted through an ultra thin specimen, interacting with the specimen as it passes through it. An image is formed from the electrons transmitted through the specimen, magnified and focused by an objective lens and appears on an imaging screen, a fluorescent screen in most TEMs, plus a monitor, or on a layer of photographic film, or to be detected by a sensor such as a CCD camera.

As used herein, if any, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, if any, the term "scanning tunneling microscope (STM)" is a technique for viewing surfaces at the atomic level. STM probes the density of states of a material using tunneling current. The STM is based on the concept of quantum tunneling. When a conducting tip is brought very near to a metallic or semiconducting surface, a bias between the two can allow electrons to tunnel through the vacuum between them. For low voltages, this tunneling current is a function of the local density of states (LDOS) at the Fermi level, $E_f$, of the sample. Variations in current as the probe passes over the surface are translated into an image.

As used herein, if any, "nanoscopic-scale," "nanoscopic," "nanometer-scale," "nanoscale," "nano-dscale," the "nano-" prefix, and the like generally refers to elements or articles having widths or diameters of less than about 1 μm, preferably less than about 100 nm in some cases. In all embodiments, specified widths can be smallest width (i.e. a width as specified where, at that location, the article can have a larger width in a different dimension), or largest width (i.e. where, at that location, the article's width is no wider than as specified, but can have a length that is greater).

Overview Of The Invention

Realizing elaborate, invisible functional circuitry continues to fuel the scientific community's interest in transparent conducing oxides (TCOs). However, notwithstanding the many reports on controlled growth of TCO-based nanostructures, the precision means to create transparent interconnects, an absolute necessity for transparent device-to-device integration, has remained elusive.

The present invention provides, among other things, FIB-doped transparent conducting wires, and the chemical properties of the FIB-doped regions leading to the transparent conducting wires. Understanding the chemical difference induced by the ion beam will in turn help unveil the mechanism of charge carrier generation. To gain insight to the chemical and structural changes, with emphasis on nanoscale information, the nanowires were made and studied using with transmission electron microscopy (TEM) techniques. One particular aim is to further examine the previously proposed, by at least some of the inventors for the present invention, mechanism[29] of charge carrier generation by oxygen vacancy creation resulting from the collision cascade during implantation. The techniques employed include bright-field (BF) and scanning TEM (STEM) imaging (also known as Z contrast imaging), and energy dispersive x-ray (EDXS) and energy loss electron (EEL) spectroscopies. Spectroscopic information was acquired in STEM mode to probe the spatial distribution of Ga and collect chemical information about oxygen sites. The previously proposed mechanism is strongly supported by selected area (SA) diffraction patterns in conjunction with conductive AFM imaging post rapid thermal anneal treatments. Features in the EEL spectra, however, may have two potential interpretations—the creation of carriers by oxygen vacancies or oxygen interstitials. Furthermore, the electrical conductivity was measured using a 4-point electrode configuration.

It is known that indium oxide is cubic material, the fully stoichiometric material is insulating[18, 30] but upon introduction of proper substitutional dopants or the creation of oxygen vacancies, charge carriers are generated and the material becomes an n-type conductor while retaining its optical transparency. From detailed x-ray diffraction studies of single crystals, indium oxide ($In_2O_3$) is of the cubic bixbyite structure, also known as the C-type rare-earth sesquioxide structure. The unit cell (body centered) has 80 atoms with a lattice parameter of 10.117 Å[31]. The crystal structure can be arrived at by removing one quarter of the anions lattice sites of the 2×2×2 fluorite superstructure, these empty anion (oxygen) sites in the bixbyite crystal are referred to in the ceramics community as structural anion vacancies. This is in fact, the most unique structural feature of this metal oxide material system. The 48 lattice oxygen atoms are found in the e sites and the 16 structural vacancies at c sites.

It has been generally accepted that in the undoped $In_2O_3$ system the generation of charge carriers are oxygen vacancies[18, 30]. However, in the past few years there have been first-principle calculation reports[32-36] of interstitial In being responsible for the intrinsic conductance of $In_2O_3$. First-principles molecular orbital calculations yield In interstitials to generate shallower donor levels than those created by oxygen vacancies. In fact, even shallower levels are formed when these interstitial In atoms complex with oxygen vacancies[35]. Another group[32] proposed that persistent photoconductivity resulting from the oxygen vacancy defect state becomes resonant inside the conduction band and leads to the observed free carriers in undoped indium oxide. In addition, recent experimental studies of the effect of oxygen partial pressure on pure and doped $In_2O_3$ propose yet another possible intrinsic defect cluster[37] that is a singly positively charged cluster composed of interstitial In and interstitial O. Despite the complexities arising from the rich chemistry of this oxide system, the consensus is that nonstoichiometry and crystal defects in $In_2O_3$ lead to charge carrier generation and that the intrinsic behavior of this metal oxide systems exhibits n-type conductivity—namely electrons are the charge carriers.

In light of the defect chemistry of indium oxide, microstructural information from single nanowires was acquired by employing electron transmission microscopy (TEM) techniques. In particular, STEM mode was combined with EDXS and EELS to spatially collect chemical information. These TEM-based techniques allow for visualization of chemical information at the nanometer scale, and some reports show atomic level information using this technique. In fact, it has been used to image single Sb dopants in Si[38], to decipher atomic structure of complex-oxide systems such as high temperature superconductors YBCO[39], and to map $sp^2$ and $sp^3$ C in diamond-Si interfaces[40], thus rendering it a key tool to understanding structure-property relationships of nano materials. In practicing the present invention, it has been used to study the spatial extent of Ga doping into the indium oxide and examine the nano-chemical change—particularly at oxygen sites—of the host oxide due to implantation doping.

The description will be made as to the embodiments of the present invention in conjunction with the accompanying drawings of FIGS. 1-8.

Implementations and Examples of the Invention

Without intent to limit the scope of the invention, exemplary methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

A. Experimental Methods

TEM sample preparation. Because one aim is to study implantation-induced phenomena, one aspect of the present invention was to create TEM samples without using traditional thinning techniques, which are based on sputtering or ion milling. Rather, in one embodiment, several TEM-transparent samples were prepared by depositing oxide films directly onto specialty TEM grids (4107SN-BA, SPI Supplies, Inc.) having a suspended 20-nm SiN membrane over 100 µm windows. Film deposition was done using a horizontal dual-gun ion-assisted deposition (HDG-IAD) system at room temperature, 30 nm of silica (99.99% from Williams Advanced Materials) followed by 38 nm of highly resistive indium oxide (99.99%, Williams Advanced Materials) were sputter deposited. Prior to oxide deposition, the grid surface was cleaned with an Ar sputter cleaning step (100 eV, 15 sec). Both the Ar cleaning and film deposition were both carried out in a system pressure of $4.4 \times 10^{-4}$ Torr and an $O_2$ partial pressure of $2.8 \times 10^{-4}$ Torr at 2.0 nm/min rate. This process yields high quality films with root mean square (RMS) roughness of 5-10 Å over 9 µm$^2$ areas and topography indistinguishable from films concurrently grown on bulk Corning 1737F glass substrates (Precision Glass & Optics). The TEM sample RMS roughness could not be measured over larger areas due to corrugation of the suspended membrane post-processing. However, this technique yields sub-nm RMS over 100 µm$^2$ when measured on the flat glass substrates.

Ion Implantation. Prior to each ion implantation, the $In_2O_3$ films were cleaned by 5 min dips (while gently swirling by hand) in the following solvents: Alconox, Millipore water, acetone, trichlorethylene, acetone, isopropanol, and water. Samples were thoroughly dried in flowing $N_{2(g)}$ and UV-ozone treated for 5 min. Immediately following the UV-ozone treatment, 8.5 nm of Au was sputtered onto them. A dual-beam FEI NanoLab 600 FIB was used to perform implantations, as shown in FIG. 2a, at beam settings of 5 kV with 1.6 pA beam current to an estimated surface dose of $4 \times 10^{16}$ ions cm$^{-2}$. The fact that the Ga ion beam can be simultaneously operated with the electron beam is an essential detail because it allows for imaging to be performed without unintentional implantation. Following FIB fabrication, the Au layer was removed with KI/I aqueous solution (Transene Company, Inc.) and the samples were again cleaned with solvents and UV-ozone as described above.

Secondary electron microscopy (SEM) images, as shown in FIG. 2b, taken immediately following ion implantation (while still in the dual-beam FIB chamber) proved to be extremely useful for relocation purposes as the doped regions are not easily discernable other than in cAFM images and lateral force microscopy (LFM) maps. FIB-doped nanowires were then electrically grounded by depositing AuPd alloy or Ti/Au stack electrodes at one end via photolithographic lift-off techniques, as shown in FIG. 2c. The film corrugation, which can be seen in FIG. 2b, introduces experimental difficulty into the photolithography processing, however it is an essential step as TEM imaging required the wires to be grounded in order to avoid severe damage through electrical charging. To confirm electrical grounding of the doped wires, cAFM imaging was performed using a modified CP Research AFM (Thermomicroscopes) and boron-doped diamond coated tips (Nanosensors UL06D, data not shown). After AFM scanning, the films were again cleaned as previously described, exposed to 5 minutes of oxygen plasma, and inserted into the TEM column for imaging.

TEM imaging and other TEM-based techniques. All TEM imaging was performed using a JEOL 2100F Schottky field emission gun TEM operated at 200 kV in either conventional or scanning TEM modes. The membrane corrugation introduced some difficulty in STEM imaging because it led to changes in working-distance, thus Ronchigram readjustment[41] was performed regularly when the beam travels more than few hundred nanometers. The energy loss near-edge spectra (ELNES) from both doped and undoped regions were collected using the Gatan imaging filter system, in STEM mode. The energy loss spectra were collected using an energy resolution of 1.0 eV estimated from the full-width at half maximum of the zero loss peak. Spectra were collected in profile mode from eight equally-spaced positions over 80 nm, using a 1 nm probe size. However, because the energy dispersion of 0.1-0.2 ev/channel was used, the total window used to collect the oxygen K-edge was only 45 eV, and owing to the high intensity of the oxygen edge, background subtraction is unnecessary for proper analysis in this case. Care was taken to minimize irradiation damage by blanking the beam whenever possible, limiting all drift collection to sacrificial regions, and utilizing very short (10 sec) collection times. Spectra calibration was performed using the zero loss peak.

Figure 3:
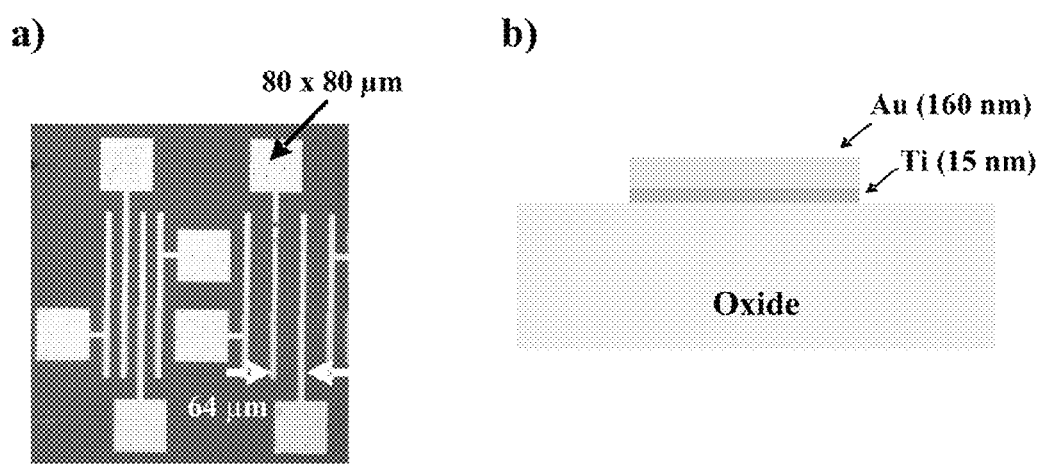
FIG. 3 shows single wire current-voltage curve according to one embodiment of the present invention: (a) Four-point probe electrode configuration with a (b) stacked Ti/Au electrode deposited on top of a doped nanowires orthogonal to electrode fingers was used to collect IV curves from a single nanowires.
Figure 4:
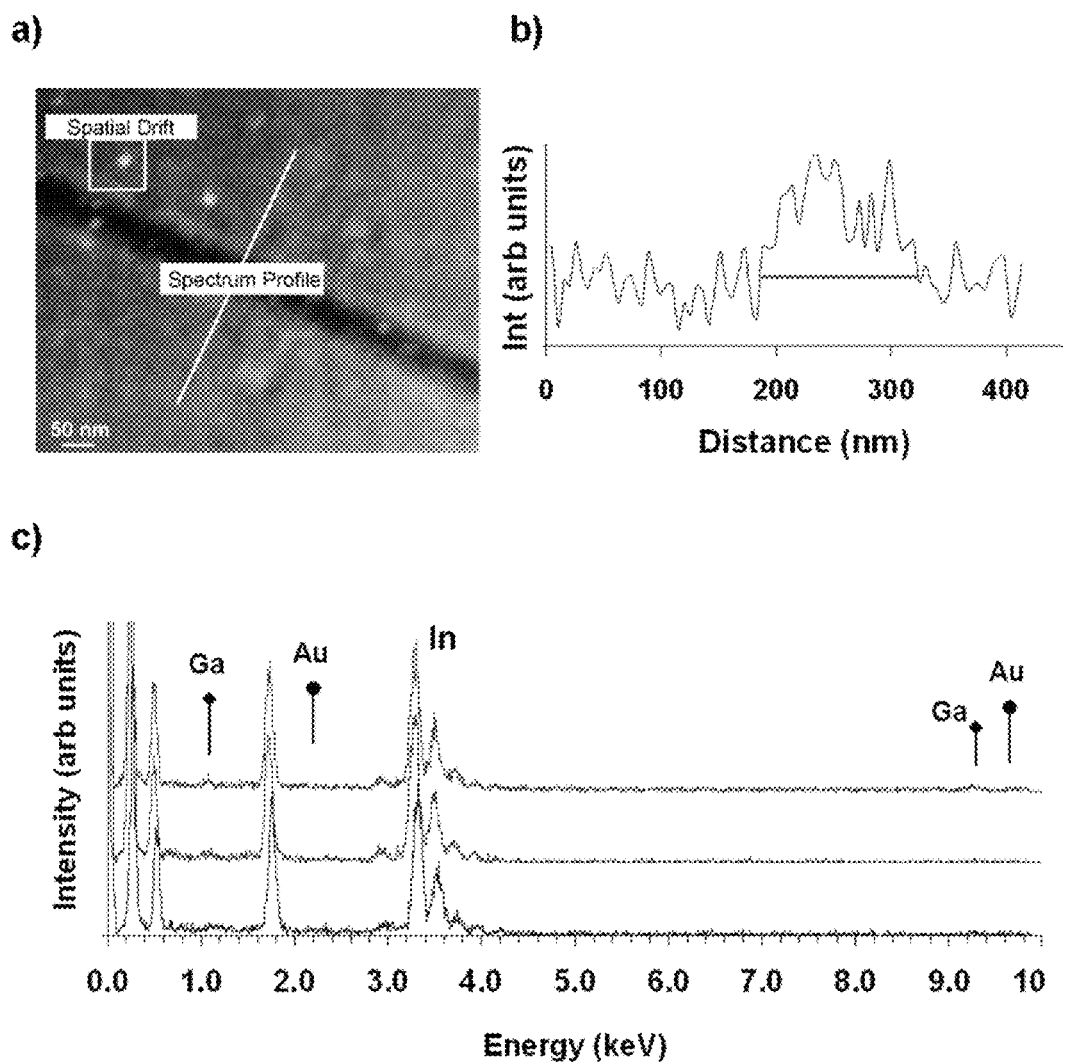
FIG. 4 shows TEM imaging and spatial chemical analysis: (a) STEM image of a FIB wire. (b) EDS Ga $L_\alpha$ profile from the white line in part (a). The dotted line denotes the 132 nm width of the doped region. (c) Three representative EDS spectra collected within the FIB-doped wire. The absence of Au at the three major Au peaks is noted (2.20, 2.29 and 9.71 keV).
Figure 5:
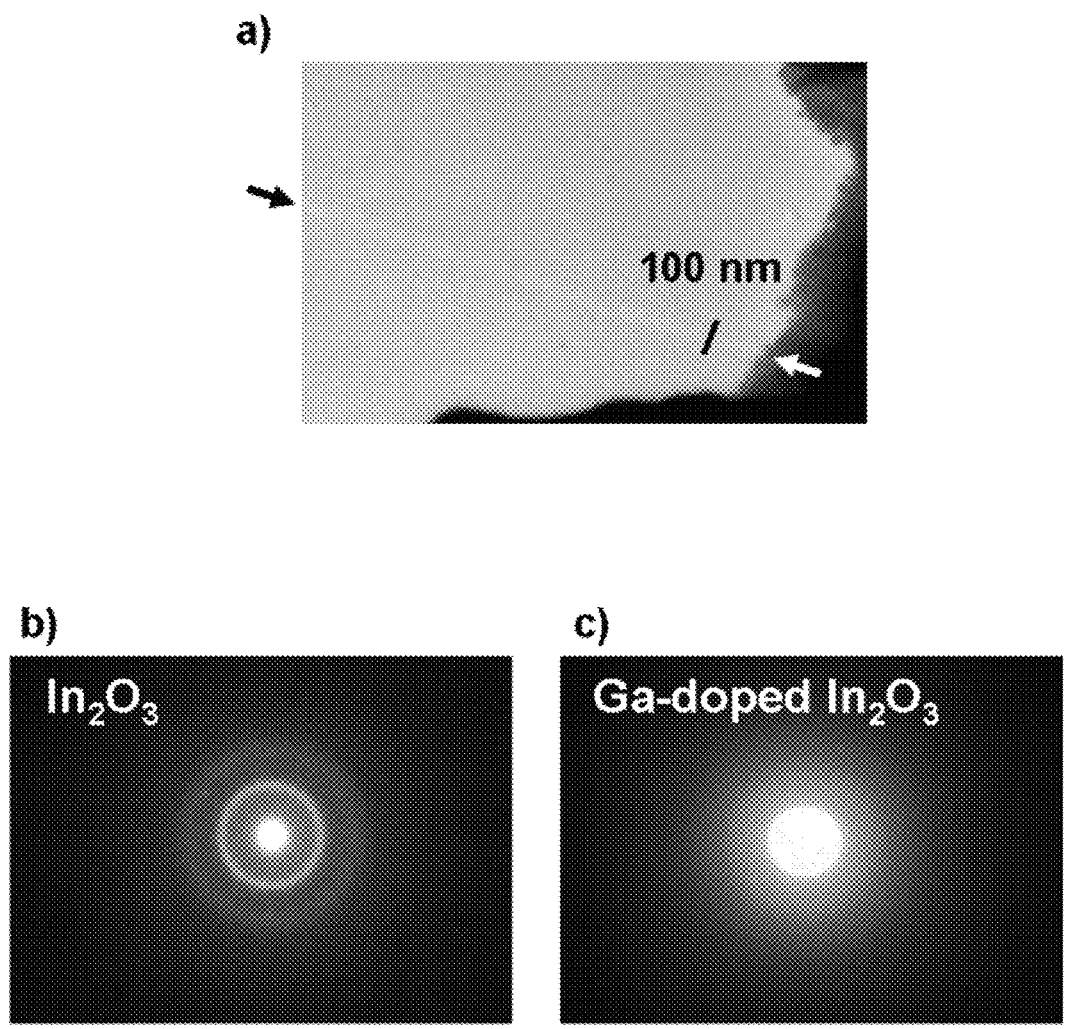
FIG. 5 shows Bright-field TEM imaging: (a) Bright-field TEM image of the FIB-doped wire. Arrows enclose wire, and the scale bar is shown across the wire. The image contrast and brightness was increased to better visualize the FIB wire. (b) Selected-area diffraction pattern taken with a ~100 nm beam from the undoped indium oxide region. Film polycrystallinity is evident from the rings and the presence of a few faint spots along the outer ring. (c) Selected-area diffraction pattern from the FIB-doped wire shows that this area has been greatly amorphized by the implantation cascade.

Electrical characterization. Electrical measurements were carried out with a 4-point AuPd alloy macroelectrode configuration (120 µm inter-electrode separation) deposited via shadow mask onto nanowires made on glass substrates as shown in FIG. 3. Voltage ranges of ±5-10 mV were used to collect IV curves with a Keithley 2400 source-meter. Rapid thermal anneals were carried out on nanowires created on thin films (not TEM grids) with a RTP-600S (Modular Process Technology Corporation) using 5 standard liters per minute flow of 100% $N_2$ or 80% $O_2$ atmospheres with a heating and cooling rate of 10° C. s$^{-1}$. Anneals were performed at 955° C., half the melting point of indium oxide, and held for 15 seconds. cAFM scanning was performed post-anneal to analyze its effect on the electrical contrast.

Results Obtained by Practicing the Present Invention

TEM Imaging. In order to explore the microstructural change due to Ga implantation, TEM imaging was performed directly through the stacked films used in AFM imaging. Nanowires were imaged in the TEM to study their crystalline and nano-chemical properties. FIG. 4a shows a typical STEM image. In this imaging mode, contrast mainly results from differences in atomic mass, a $Z^2$ dependence where Z is the element atomic number, with negligible contribution from diffraction or crystal structure. STEM contrast from heavier elements is brighter while lighter elements appear dark, thus STEM images provide a chemical map of the sample. STEM mode was used to measure the electrically active width by laterally profiling the Ga doping distribution within the host oxide.

A Ga EDS profile, as shown in FIG. 4b, was collected over the white line in FIG. 4a sampling about 420 nm of both doped and undoped oxide with 80 evenly-spaced data points (1 nm beam). The signal-to-noise ratio is low due to the small dimensions of the nanowire (7 nm deep, see supplementary information in Sosa et al) and the electron probe (1 nm). Nevertheless, the increase of Ga $L_\alpha$ in doped regions is evident. When measured from the profile EDS spectra, as shown in FIG. 4b, the FIB doped wire has a chemical width of ~135 nm. For completeness, the full EDS spectrum is shown in FIG. 4c and will be further discussed in more detail infra.

When imaged in BF mode, the wires yield very low contrast, as shown in FIG. 5a. Consequently, the image has been enhanced by increasing the digital contrast via a standard graphics program in order to show the wire in FIG. 5a (flanked by arrows). Using a 100 nm beam, SA diffraction patterns were collected from both the doped and undoped areas, as shown in FIGS. 5b and 5c, respectively. Undoped regions are clearly polycrystalline as noted by the rings and the diffraction spots within the outer ring. In marked contrast, although faint remnants of one ring are present, the Ga-doped region show almost completely amorphous characteristics.

The lack of crystal structure within the doped area demonstrates the microstructural disorder induced by FIB implantation.

Figure 6:
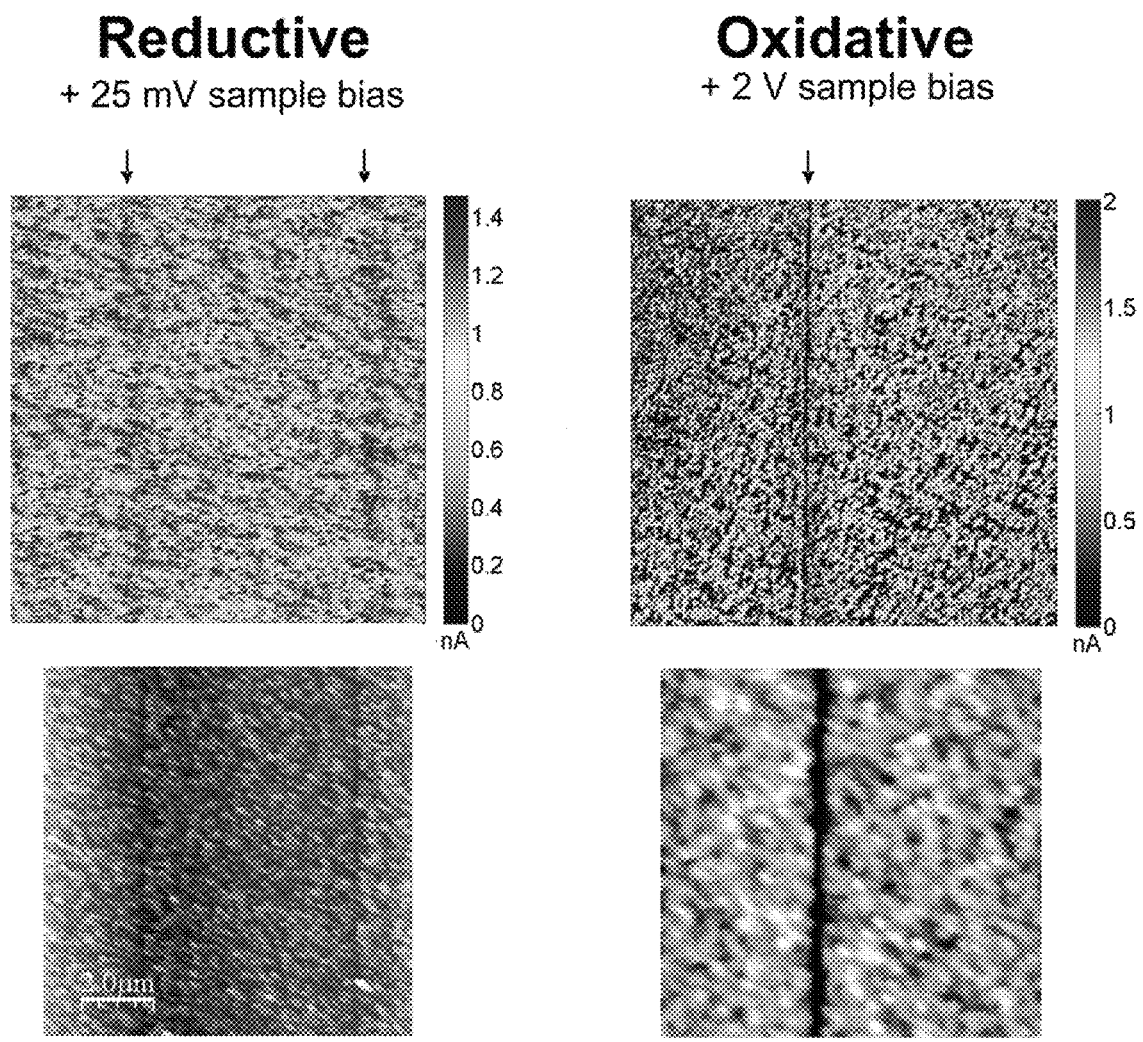
FIG. 6 shows rapid thermal anneal treatments (RTA): Current maps (top) and topography (bottom) after rapid thermal anneal treatments. Arrows point to nanowires. (a) Reductive atmosphere ($N_2$) during RTA essentially erased FIB-doping effect while raising the overall film conductance as evidenced by the low bias necessary to obtain ~0.5 nA average across the imaged area. (b) Oxidative atmosphere (80% $O_{2(g)}$), also erased the FIB-doping induced nanowires but lowered the overall film conductance as evidenced by the much higher bias necessary to obtain similar current map scale as for the reductive treatment.

Anneal Treatments. The hypothesis of disorder-induced doping via oxygen vacancies was tested with annealing treatments in both reducing and oxidizing environments. It has been reported that reductive anneals of TCOs aid in carrier generation[42, 43] and the reverse behavior is observed for oxidizing conditions. In fact, the conductivity can be cycled with oxidative/reductive rotations[43]. Rapid thermal anneal treatments (RTA) have also been studied for the modification of TCO electrical properties[44-46]. FIG. 6 shows current and topography maps of two FIB-doped wires after reductive, as shown in FIG. 6a, and oxidative RTA treatments, as shown in FIG. 6b, respectively (the images shown are of wires created on blanket thin films and not the TEM suspended membranes). Here, RTA treatments (15 sec) in flowing $N_{2(g)}$ caused an increase in the conductance of the entire surface, as noted in cAFM current maps, to the extent where 25 mV sample bias induces substantial tip-sample current flow. The reductive RTA essentially 'erased' the contrast previously created by the doping. On the other hand, RTA treatments in oxidizing conditions resulted in greatly decreasing the conductance of the wire a level similar to that the background. A substantially higher bias (as noted in the figures) is necessary to achieve a similar electrical current scale as FIG. 6a.

Nanoscale Chemical Analysis. In previous report(s) made by at least some of the inventors, SIMS depth profiling showed negligible Au content at both the surface and within the Ga-doped depth. The Au was eliminated as the possible origin of increased conductance in doped regions. In practicing the present invention, once again this concern was addressed. Full EDS profiles were simultaneously collected during the Ga profiling, thus Au signals could be analyzed across the nanowires. FIG. 4c shows three full EDS profiles taken at different positions within the FIB doped wire. It is clear that the three major Au peaks (2.20, 2.29, and 9.7 keV, all of similar strong intensities) are not observed in EDS spectra taken within FIB doped areas.

Figure 7:
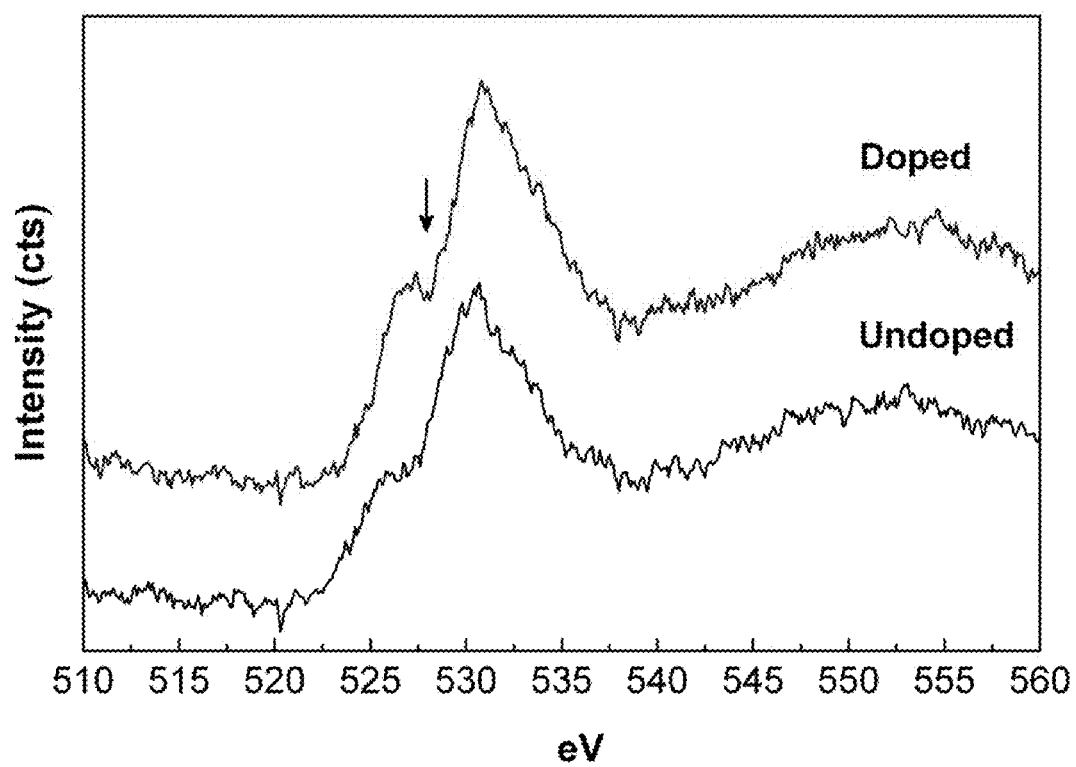
FIG. 7 shows EELS oxygen edge: Representative EEL spectra from doped and undoped regions collected using STEM mode. Eight, equally separated (10 nm) measurements were carried out in profile mode over doped and undoped material. The pre-edge 'dip' feature noted by the arrow is one which is associated with changes in the chemical environment around the oxygen sites, either as oxygen vacancies or oxygen interstitials. Either of which have the potential to induce charge carriers in doped regions.

Spatially resolved chemical imaging was performed employing incoherent Z-contrast imaging, where Z represent atomic mass, using a high-angle annular dark field (HAADF) detector. FIG. 7 shows the representative results for both FIB-implanted and non-implanted areas probed with EEL spectroscopy. The prominent difference between the two regions is the feature preceding the oxygen K-edge (O K-edge) seen in the doped spectrum. The oxygen EEL spectrum has only one edge, a K-edge, and has been well-studied, particularly for transition metal oxides. The O K-edge has a step-like, abrupt onset at 532 eV and it is strong in intensity and rich in features indicative of its chemical environment. The energy-loss near-edge structure (ELNES) can be seen in the spectra, for doped and undoped regions in the sample. For doped regions, 7 out of 8 spectra collected show the pre-edge 'dip' feature at 527 eV. In undoped material, however, EEL spectra show either inclined slope over this 525-528 eV range (6 out of 8 spectra) or zero slope (2 out of 8).

Figure 8:
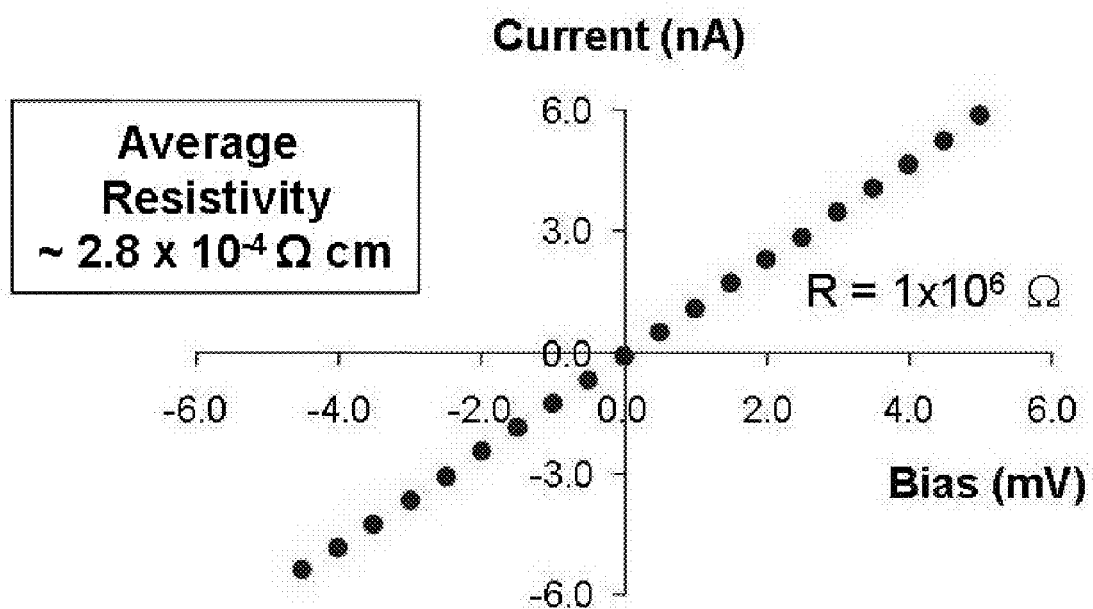
FIG. 8 shows ohmic behavior from single nanowires according to one embodiment of the present invention. The inverse of the slope of the IV curves collected was calculated to be $1 \times 10^6 \Omega$ (with an $R^2$ fit of 0.9988 using linear regression). The average resistivity value given in the inset was taken from multiple measurements of two wires prepared on separate days and samples. The dimensions for the wire used were 110 nm width, 3.1 nm deep, and 120 μm length.

Electrical Measurements. The electrical conductivity of the nanowires was measured with a 4-point probe electrode configuration as shown in FIG. 3a. With this electrode structure and knowing wire dimensions the conductivity can be extracted. FIG. 8 shows a representative current-voltage curve obtained from a single nanowire, which exhibits linear, Ohmic behavior. An estimate of wire conductivity ($\sigma$) can be calculated using the formula $\sigma=1/(RA)$, where l is the wire length (the electrode separation was 120 µm), R is the resistance (inverse of the current-voltage curve slope), and A is the wire cross-sectional area. Defining the cross-sectional area of a wire resulting from implantation can be difficult because the dopant distribution is not a step profile: the boundary between doped and undoped material is not an abrupt one. Rather, the distribution has an approximately exponential decay—most of the dopant is concentrated within 5 nm of the oxide surface, and Ga signal was no longer detectable[29] beyond 7 nm. Therefore, to calculate a conductivity estimate, the total Ga depth was approximated by drawing a step-like profile with of the same area as the area under the experimental dopant profile curve, which gives an approximate dopant depth of 3.1 nm. Using this dimension estimate, the average wire resistivity is on the order of $2.8 \times 10^{-4}$ Ωcm.

Understanding Results Obtained by Practicing the Present Invention

For in-depth microstructural studies, TEM-ready sample were achieved using specialty grids. This preparation scheme results in unaltered nanowires which could be scanned directly with the AFM and subsequently imaged with TEM. Thus the same wire was explored in terms of its chemical, microstructural, and electrical properties. Nanoscale chemical investigations provide evidence to the spatial control of this doping technique. Using STEM mode, chemical image maps are acquired and the extent of Ga doping is easily observed. Spatially resolved chemical imaging was performed employing incoherent Z-contrast imaging, where Z represent atomic mass, using the JEOL 2000F high-angle annular dark field (HAADF) detector. Image contrast is approximately proportional to $Z^n$, where the constant n depends on collection angle $6 < n < 2$[47, 48]. Sharp contrast is noted between doped and undoped areas, denoting the spatial control achieved in the Ga doping.

When the electron probe is controlled to scan across a single nanowire while collecting the EDS signal, further chemical information detail of the Ga content is achieved. The Ga EDS Lα (1.098 keV) peak was chosen because it is strong and isolated from other signals. In this case, the signal intensity was only ~3 times that of the background due to the extremely small volumes being probed, nevertheless it is clear that the technique allows for measurement of lateral spread of Ga (FIG. 4b). The chemical width measured in this particular profile is ~135 nm. However, it must be noted that this width is artificially broadened due to electron scattering as a function of sample thickness, namely volume sampling is at play.

Further chemical EDS analysis yields important information about possible Au incorporation. The implantation technique requires an anticharging layer, which we chose to be Au since it can be easily removed without the use of acidic etches, as most metals must, since indium oxide is acid-sensitive. Whether Au is unintentionally incorporated via knock-on implantation during FIB processing is an important concern. In the inventors' previous work[29], the Au peak was monitored throughout SIMS depth profiling experiments where very large areas (28×28 µm) were necessary to achieve reasonable signal-to-noise ratios. Negligible Au peak counts were collected throughout SIMS collection. Here, in contrast, the issue is addressed at the nanoscale. FIG. 3c shows three representative, full EDS spectra which confirm the absence of the three strongest Au EDS peaks. The three spectra were taken at locations within the doped metal oxide. One key difference between the present study and the inventors' previous report is that in the previous report the Au SIMS peak was monitored as depth profiling was performed. However, here the signal is collected with a 1 nm electron beam that probes the entire sample thickness. Thus, the signal is of high lateral selectivity yet with full-depth range. The EDS data unequivocally confirms absence of Au from the doped regions. These spectra confirm the absence of Au noted in SIMS depth profiling and corroborates the claim that spurious implantation of Au during FIB implantation does not contribute to the increased conductivity achieved with this fabrication process.

So far, STEM provides chemical contrast imaging, and EDS shows the lateral extent of Ga doping and proves the absence of Au. On the other hand, bright field (BF) imaging and selected area (SA) diffraction, provide information about the microstructural changes resulting from doping. The image contrast in BF originates from both sample thickness and crystal structure—lower intensities are transmitted through thicker samples due to increased scattering and absorption, and to increased diffraction by crystalline materials. Since it has been shown that this doping technique leads to minimal topography change—namely negligible thickness difference is expected, particularly relative to the 88 nm total sample thickness—the contrast seen here can be then attributed to a change in crystal structure, particularly amorphization of the film crystallites. However, the boundary of crystalline and amorphized oxide is not easily imaged in BF mode, especially at higher magnifications. Therefore, selected area (100 nm) diffraction patterns were collected from doped and undoped oxide. The polycrystalline nature of the host undoped oxide is evident in FIG. 5b, and FIG. 5c readily confirms the lack of microstructure in Ga-doped $In_2O_3$ regions. These SA diffraction patterns reveal the results of the collision cascade and provides direct assessment of microstructural disorder in doped areas.

The self-doping[49] ability of $In_2O_3$ can be described using Kröger-Vink notation, where the subscripts denote the site where the defect resides, and superscripts denote defect charge as follows: (*) neutral, (.) positive, and (') negative charge. Thus, oxygen vacancies in the bixbyite structure can be represented as

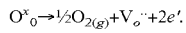

Each oxygen vacancy point defect allows for two electrons to be donated to the conduction band.

To help explore the possibility that increased conductivity is due to collision-created oxygen vacancies, anneal treatments were performed. In particular, rapid anneal (RTA) treatments were employed in order to avoid significant diffusion of Ga dopants, or other potentially important chemical or ionic species. The trend is strong and supports the theory that oxygen vacancies created via knock on collision during implantation leads to increased local conductance in the Ga doped oxide. It should also be noted that while the electrical properties were certainly changed by RTA treatments, morphological changes were not observed. In particular, the trench created by FIB processing remains intact following the reductive and oxidizing RTA, as shown in FIG. 6. However, the pre-edge feature recorded in EEL oxygen spectra does not allow for interstitial oxygen to be ruled out as the origin for significant change in conductance in doped regions. As a last point of the defect chemistry in this oxide system, acceptor-type doping can be ruled out since indium oxide is known to be non-amphoteric[50] and a n-type conductor. Moreover, the singly charged $Ga^+$ ions are not expected to be acceptor-type dopants because ionic compensation in this metal oxide would null this effect[49].

Chemical contrast images are created in STEM mode. As mentioned in the earlier discussion, Z contrast images are collected through the HAADF detector. This detector is particularly useful because it does not interfere with electron inelastic scattering, as it is positioned below the sample. The combination of Z-contrast imaging (structure and composition) and EELS (composition and bonding characteristics) affords direct, nanoscale chemical characterization of Ga-doped and stoichiometric oxide regions.

EEL spectroscopy probes local density of unoccupied states. Of particular interest are the core-loss energies corresponding to the oxygen chemical environment, namely the O K-edge. The EEL O absorption K-edge originates from transitions from the O-K shell into unoccupied oxygen 2p states. These characteristics render EEL spectroscopy ideal to study metal oxides; many systems have been studied including $SnO_2$ compared with $SiO_2$[51], $LaCoO_3$ and $YB_2Cu_3O_7$[39], $SrTiO_3$[47], oxidation of Sn[52,53], $PbTiO_3$[54], $HfO_2$[55], vanadium oxides[56], niobium oxides[57], $SrCoO_3$[58], $Sn-In_2O_3$[59, 60], among others.

The 'dip-like' pre-edge feature at 527 eV has been noted in other metal oxides systems. For example, Lin et al[56] studied the O K edges of $V_2O_5$, $VO_2$, $V_2O_3$, and oxide systems, which exhibited two oxygen pre-edge peaks. They found that the ratios between the intensities of the first oxygen pre-edge peak and the second correlated with decreasing vanadium valence. Furthermore, when phosphorous vanadium oxides, $(VO)_2P_2O_7$, were considered significant changes in the O K edge were noted due to the d-p-σ hybridization, the P σ character contributing to the picture. In another study[55] in which the Hf/Al ratio was varied in hafnium aluminate thin films from 1/0 to 0/1, it was found that the addition of Al to pure hafnia interacts with two intrinsic oxygen defects—vacancies and interstitials—found in these pure oxide. In a similar investigation, the oxygen pre-edge features were seen in the monoclinic phase of the $HfO_2$ system upon yttrium and aluminum incorporation[61], and was attributed to the defect-induced DOS formed[61]. The pre-edge peak was observed in experimental data but not in simulated EEL spectra. The incorporation of Y (+3) into $HfO_2$ (+4), requires that oxygen vacancies form in order to maintain charge neutrality. Furthermore, EELS studies of superconducting oxides systems have also routinely shown pre-edge feature at the oxygen edge[62]. In these studies, the features is associated with a hole at the oxygen site. Thus it is evident that a marked contrast in oxygen chemical environment leads to charge carriers, but whether the origin is oxygen vacancies or interstitials is yet to be determined.

It is important to note the absence of other potential spectral differences, i.e., shifts in the O K-edge onset. Such a shift would denote a change in binding energy, which would be indicative of changes in oxygen bonding, i.e. bond lengths. Another potential difference not observed is double peaks in the O K-edge energy loss region, this type of feature is typically seen in transitional metal oxides in which crystal splitting between the metal and the oxygen i.e. hydridization of the O 2p orbitals with metal 3d orbitals[39, 56, 63]. This kind of spectral feature is useful in determining the metal coordination symmetry, specifically when metal exists in multi-valence states.

In terms of EELS information about the Ga dopants, the only region accessible to the present study is the $M_{2,3}$ edge at 103 eV, this edge has a delayed maximum and has detectable intensity but it unfortunately cannot be used to study any valence state information of Ga because the two transitions, yielding information on the 3p shell ($M_2$ and $M_3$), are overlapped. The valance state is typically extracted from spectra by analysis of changes in ratios of $X_2$ to $X_3$, where X represents some electronic shell. This EEL transition landscape may partially explain the lack of literature in Ga EEL valence spectroscopy. Therefore, in order for this information to be properly collected, reference samples of known oxidations of Ga would have to be carefully prepared with the chemical state confirmed via other techniques. This effort is, however, beyond the scope of the study at hand. No other prominent difference is noted when full EEL spectra were carefully analyzed.

When these TEM results are viewed in context of the IV curves obtained for these nanowires, the fact that the indium oxide system self-dopes via oxygen vacancies (discussion below), and that Ga and In are isovalent, it can be deduced that the changes in microstructure lead to the electrical activity of these wires. When IV curves are collected in 4-point electrode configuration, and the dimensions of the wires are carefully estimated, an approximate value for the conductivity is attained. Traditionally-deposited Ga-doped $In_2O_3$ thin films exhibit respectable conductivities, which vary from 500 to 1,724 S cm$^{-1}$ (Table 1). The conductivity average for these FIB-doped transparent conducting nanowires is measured to be about 3,600 S cm$^{-1}$. The conductivity value measured for the wires is higher than the literature precedent for Ga-doped $In_2O_3$ thin films but within the typical range for a TCO material.

TABLE 1

Ga-doped $In_2O_3$ properties reported in the literature

| Method | σ (S/cm) | n (cm$^{-3}$) | Year |
|---|---|---|---|
| RF MSD | 500 | 1.00E+20 | 1999[64] |
| DC MSD | 667 | 3.50E+20 | |
| RF sMSD (post-annealed) | 370 | 1.00E+20 | 2000[65] |
| DC MSD | 1724 | 1.00E+20 | |
| MOCVD | 700 | 8.10E+19 | 2002[66] |
| MOCVD (post-anneal) | 140 | 1.40E+20 | |
| Pressed from powder | 250 | 1.00E+19 | 1994[42] |
| DC MSD, PLD | 400 | 4.00E+20 | 1994[67] |

RF MSD = radio frequency metal sputter deposition
DC MSD = direct current metal sputter deposition
MOCVD = metal-organic chemical vapor deposition
PLD = pulsed laser deposition During implantation, the collision cascade creates lattice damage, knocking enough oxygen out of their lattice points, leading to oxygen vacancies and interstitials being created. The self-doping[49] ability of $In_2O_3$ is known, where each oxygen vacancy point defect allows for two electrons to be donated to the conduction band. Recently, first-principle simulations point to the possibility of oxygen interstitials forming shallower donor levels, thus oxygen interstitials formed could lead to carriers via this mechanism. Alternatively, it is plausible that the mere amorphization of the oxide, namely the phase change, could be the origin of higher conductance. Amorphous TCO systems[68, 69] have been reported, examples include $In_{0.8}Zn_{0.2}O_y$,[70] which exhibits conductivities in the range of $3 \times 10^3$ S cm$^{-1}$. Thus, it is conceivable that a phase difference can lead to a difference in local electrical properties. Lastly, acceptor-type doping can be ruled out because indium oxide is known to be non-amphoteric[50] and a n-type conductor. Moreover, the singly charged Ga$^+$ ions are not expected to be acceptor-type dopants because ionic compensation in this metal oxide would null this effect[49]. Thus, it can be deduced that the generation of charge carriers is through either the creation of oxygen vacancies or oxygen interstitials.

Accordingly, in sum, practicing the present invention provides novel, FIB-patterned TCO nanowires and reveals the chemical and electrical properties of the novel, FIB-patterned TCO nanowires. The preparation of TEM-ready samples is presented, which allowed for TEM-based studies of single wires. Differences in the diffraction patterns between doped and undoped oxides regions, accompanied by RTA results, support the claim that oxygen vacancies are the likely doping mechanism in this system. The same single wire underwent chemical profiling, information which aided in understanding the lateral extent of Ga doping, and agreed well with previously reported cAFM imaging[29]. In addition, spatially-selective nanoscale EELS spectroscopy provided supporting evidence of changes to the chemical environment at oxygen sites present within doped oxide, and of the lack thereof in the undoped surrounding material with two potential interpretations of the pre-edge feature on the oxygen K-edge. Thus, charge carrier generation is likely through (or a combination of) the creation of oxygen vacancies, oxygen interstitials, or potentially phase-change induced.

Also, the conductivity measured for these wires, which is about 3600 S cm$^{-1}$, is of a respectable value and fall within reason for conventionally-grown Ga-doped $In_2O_3$ thin films. This high conductivity coupled with the direct write flexibility of FIB presents a promising strategy for implementing transparent conducting interconnects in invisible electronics. Other possibilities may extend into other realms of the materials chemistry field. For example, conductively-patterned indium oxide surfaces can perhaps serve to selectively induce electrochemical reactions leading to a spatially-patterned product. Similarly, thermally-induced reactions can be locally catalyzed by creating a microscale resistive heater with properly-prepared nanowires—for examples, if the wires are written in a serpentine fashion, with the proper ion dose to achieve the correct resistance, and while applying a bias across them. Other examples include electrically-driven sensing surfaces. Lastly, these nanoscale TCO features are envisioned to be useful in any other applications where spatially-patterned chemical, work function, or surface termination differences are employed.

Accordingly, the present invention, among other things, discloses the chemical and electrical properties of transparent conducting oxide nanowires (Ga-doped $In_2O_3$) via direct write focus ion beam (Ga$^+$) doping that create spatially-modified electrical features embedded within the oxide substrate ($In_2O_3$). In particular, to gather nanoscale chemical information, TEM-ready samples were prepared to investigate single nanowires with a combination of TEM-based imaging and spectroscopic techniques. Energy dispersive x-ray spectroscopy is used to study the lateral distribution of Ga doping. In addition, rapid thermal anneal experiments and energy loss electron spectroscopy oxygen edge fine structure support the theory that charge carriers are possibly being generated through the creation of oxygen vacancies—a known dopant in this metal oxide system. The nanowires exhibit Ohmic behavior and their conductivity value is measured as 3600 S cm$^{-1}$—in the same scale as traditionally-deposited Ga-doped indium oxide. In combination with TCO-based transistors being reported in the literature, it is conceivable that the electrical properties induced via FIB-controlled changes to the chemical composition of indium oxide shown here can lead to the realization of truly all-TCO based transparent electronics. Lastly, the utility of these spatially-controlled TCO features are also foreseen in other applications.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

1. Burstein, E., Anomalous optical absorption limit in InSb. *Physical Review* 1953, 632-633.
2. Tennenbaum, M., and Briggs, B. H., Optical properties of indium antimonide. *Physical Review* 1953, 91, (6), 1591-1592.
3. Gordon, R. G., Criteria for Choosing Transparent Conducting Oxides. *MRS Bulletin* 2000, (August), 52-27.
4. Weiher, R. L.; Ley, R. P., Optical Properties of Indium Oxide. *Journal of Applied Physics* 1966, 37, (1), 299-302.
5. Lewis, B. G.; Paine, D. C., Applications and Processing of Transparent Conducting Oxides. *MRS Bulletin* 2000, (August), 22-27.
6. Freeman, A. J.; Poeppelmeier, K. R.; Mason, T. O.; Chang, R. P. H.; Marks, T. J., Chemical and thin-film strategies for new transparent conducting oxides. *MRS Bulletin* 2000, 25, (8), 45-51.
7. Chaney, J. A.; Pehrsson, P. E., Work function changes and surface chemistry of oxygen, hydrogen, and carbon on indium tin oxide. *Applied Physics Letters* 2001, 180, 214-226.
8. Christou, V.; Ethcells, M.; Renault, O.; Dobson, P. J.; Salata, O. V.; Beamson, G.; Edgell, R. G., High resolution x-ray photoemission study of plasma oxidation of indium-tin-oxide films surfaces. *Journal of Applied Physics* 2000, 88, (9), 5180-5187.
9. Park, Y.; Choong, V.; Gao, Y.; Hsieh, B. R.; Tang, C. W., Work function of indium tin oxide transparent conductor measured by photoelectron spectroscopy. *Applied Physics Letters* 1996, 68, (19), 2699-2701.
10. Purvis, K. L.; Lu, G.; Schwartz, J.; Bernasek, S. L., Surface characterization and modification of indium tin oxide in ultrahigh vacuum. *Journal of the American Chemical Society* 2000, 122, 1808-1809.
11. Brewer, S. H.; Franzen, S., Optical properties of indium tin oxide and fluorine-doped tin oxide surfaces: Correlation of reflectivity, skin depth, and plasmon frequency with conductivity. *Journal of Alloys and Compounds* 2002, 338, 73-79.
12. Fan, J. C. C.; Goodenough, J. B., X-ray photoemission spectroscopy studies of Sn-doped indium-oxide films. *Journal of Applied Physics* 1977, 48, (8), 3524-3531.
13. Hamberg, I.; Granqvist, C. G., Evaporated Sn-doped $In_2O_3$ films: Basic optical properties and applications to energy-efficient windows. *Journal of Applied Physics* 1986, 60, (11), R123-R159.
14. Nakao, T.; Nakada, T.; Nakayama, Y.; Miyatani, K.; Kimura, Y.; Saito, Y.; Kaito, C., Characterization of indium tin oxide film and practical indium oxide film by electron microscopy. *Thin Solid Films* 2000, 370, 155-162.
15. Tahar, R. B. H.; Ban, T.; Ohya, Y.; Takahashi, Y., Tin doped indium oxide thin films: Electrical properties. *Journal of Applied Physics* 1998, 83, (5), 2631-2645.
16. Behdani, M.; Rastegar, A.; Keshmiri, S. H.; Missat, S. I.; Vlieg, E.; Rassing, T., Submicron liquid crystal pixels on a nanopatterned indium tin oxide surface. *Applied Physics Letters* 2002, 80, (24), 4635-4637.
17. Jin, S.; Yang, Y.; Medvedeva, J. E.; Ireland, J. R.; Metz, A. W.; Ni, J.; Kannewurf, C. R.; Freeman, A. J.; Marks, T. J., Dopant ion size and electronic structure effects on transparent conducting oxides. Sc-doped CdO thin films grown by MOCVD. *Journal of the American Chemical Society* 2004, 126, 13787-13793.
18. Chopra, K. L.; Major, S.; Pandya, D. K., Transparent Conductors—a Status Review. *Thin Solid Films* 1983, 102, (1), 1-46.
19. Nomura, K.; Ohta, H.; Takagi, A.; Kamiya, T.; Hirano, M.; Hosono, H., Room-temperature fabrication of transparent flexible thin-film transistors using amorphous oxide semiconductors. *Nature* 2004, 432, (7016), 488-492.
20. Wang, L.; Yoon, M. H.; Lu, G.; Yang, Y.; Facchetti, A.; Marks, T. J., High-performance transparent inorganic-organic hybrid thin-film n-type transistors. *Nature Materials* 2006, 5, (11), 893-900.
21. Nomura, K.; Ohta, H.; Ueda, K.; Kamiya, T.; Hirano, M.; Hosono, H., Thin-film transistor fabricated in single-crystalline transparent oxide semiconductor. *Science* 2003, 300, (5623), 1269-1272.
22. Yavas, O.; Takai, M., High-speed maskless laser patterning of thin films for giant microelectronics. *Japanese Journal of Applied Physics Part 1—Regular Papers Short Notes & Review Papers* 1999, 38, (12B), 7131-7134.
23. Molloy, J.; Maguire, P.; Laverty, S. J.; McLaughlin, J. A., The reactive ion etching of transparent electrodes for flat panel displays using Ar/Cl-2 plasmas. *Journal of the Electrochemical Society* 1995, 142, (12), 4285-4289.
24. Chen, M. F.; Chen, Y. P.; Hsiao, W. T.; Gu, Z. P., Laser direct write patterning technique of indium tin oxide film. *Thin Solid Films* 2007, 515, (24), 8515-8518.
25. Chae, J.; Appasamy, S.; Jain, K., Patterning of indium tin oxide by projection photoablation and lift-off process for fabrication of flat-panel displays. *Applied Physics Letters* 2007, 90, (26).
26. Breen, T. L.; Fryer, P. M.; Nunes, R. W.; Rothwell, M. E., Patterning indium tin oxide and indium zinc oxide using microcontact printing and wet etching. *Langmuir* 2002, 18, (1), 194-197.
27. Catalan, A. B.; Mantese, J. V.; Hamdi, A. H.; Laugal, R. C. O.; Micheli, A. L., Formation of Patterned Tin Oxide Thin-Films by Ion-Beam Decomposition of Metalorganics. *Thin Solid Films* 1990, 188, (1), 21-26.
28. Hamdi, A. H.; Laugal, R. C. O.; Catalan, A. B.; Micheli, A. L.; Schubring, N. W., Doping, Patterning and Analysis of Tin Oxide-Films Using Ion-Beams. *Thin Solid Films* 1991, 198, (1-2), 9-15.
29. Sosa, N. E.; Liu, J.; Chen, C.; Marks, T. J.; Hersam, M. C., Nanoscale Writing of Transparent Conducting Oxide Features with a Focused Ion Beam. *Advanced Materials* 2009, 21, (6), 721-725.
30. Bender, M.; Katasarakis, N.; Gagaoudakis, E.; Hourdakis, E.; Douloufakis, E.; Cimalla, V., Dependence of the photoreduction and oxidation behavior of indium oxide films on substrate temperature and film thickness. *Journal of Applied Physics* 2001, 90, (10), 5382-5387.
31. Marezio, M., Refinement of Crystal Structure of In2O3 at 2 Wavelengths. *Acta Crystallographica* 1966, 20, 723-&.
32. Lany, S.; Zunger, A., Dopability, intrinsic conductivity, and nonstoichiometry of transparent conducting oxides. *Physical Review Letters* 2007, 98, (4).

33. Mryasov, O. N.; Freeman, A. J., Electronic band structure of indium tin oxide and criteria for transparent conducting behavior. *Physical Review B* 2001, 64, (23).
34. Tanaka, I.; Tatsumi, K.; Nakano, M.; Adachi, H.; Oba, F., First-principles calculations of anion vacancies in oxides and nitrides. *Journal of the American Ceramic Society* 2002, 85, (1), 68-74.
35. Tomita, T.; Yamashita, K.; Hayafuji, Y.; Adachi, H., The origin of n-type conductivity in undoped In2O3. *Applied Physics Letters* 2005, 87, (5).
36. Warschkow, O.; Ellis, D. E.; Gonzalez, G. B.; Mason, T. O., Defect structures of tin-doped indium oxide. *Journal of the American Ceramic Society* 2003, 86, (10), 1700-1706.
37. Ohya, Y.; Yamamoto, T.; Ban, T., Equilibrium dependence of the conductivity of pure and tin-doped indium oxide on oxygen partial pressure and formation of an intrinsic defect cluster. *Journal of the American Ceramic Society* 2008, 91, (1), 240-245.
38. Voyles, P. M.; Muller, D. A.; Grazul, J. L.; Citrin, P. H.; Gossmann, H. J. L., Atomic-scale imaging of individual dopant atoms and clusters in highly n-type bulk Si. *Nature* 2002, 416, (6883), 826-829.
39. Klie, R. F.; Zhao, Y.; Yang, G.; Zhu, Y. M., High-resolution Z-contrast imaging and EELS study of functional oxide materials. *Micron* 2008, 39, (6), 723-733.
40. Muller, D. A.; Tzou, Y.; Raj, R.; Silcox, J., Mapping Sp(2) and Sp(3) States of Carbon at Subnanometer Spatial-Resolution. *Nature* 1993, 366, (6457), 725-727.
41. Sigle, W., Analytical transmission electron microscopy. *Annual Review of Materials Research* 2005, 35, 239-314.
42. Cava, R. J.; Phillips, J. M.; Kwo, J.; Thomas, G. A.; Vandover, R. B.; Carter, S. A.; Krajewski, J. J.; Peck, W. F.; Marshall, J. H.; Rapkine, D. H., GaInO$_3$—a New Transparent Conducting Oxide. *Applied Physics Letters* 1994, 64, (16), 2071-2072.
43. Hwang, J. H.; Edwards, D. D.; Kammler, D. R.; Mason, T. O., Point defects and electrical properties of Sn-doped In-based transparent conducting oxides. *Solid State Ionics* 2000, 129, (1-4), 135-144.
44. Kim, J. H.; Du Ahn, B.; Lee, C. H.; Jeon, K. A.; Kang, H. S.; Lee, S. Y., Effect of rapid thermal annealing on electrical and optical properties of Ga doped ZnO thin films prepared at room temperature. *Journal of Applied Physics* 2006, 100, (11).
45. Ma, T. Y.; Shim, D. K., Effects of rapid thermal annealing on the morphology and electrical properties of ZnO/In films. *Thin Solid Films* 2002, 410, (1-2), 8-13.
46. Weijtens, C. H. L., Influence of the Deposition and Anneal Temperature on the Electrical Properties of Indium Tin Oxide. *Journal of Electrochemical Society* 1991, 138, (11), 3432-3434.
47. Klie, R. F.; Zhu, Y., Atomic resolution STEM analysis of defects and interfaces in ceramic materials. *Micron* 2005, 36, (3), 219-231.
48. Browning, N. D.; Chisholm, M. F.; Pennycook, S. J., Atomic-Resolution Chemical-Analysis Using a Scanning-Transmission Electron-Microscope. *Nature* 1993, 366, (6451), 143-146.
49. Mason, T. O.; Gonzalez, G. B.; Kammler, D. R.; Mansourian-Hadavi, N.; Ingram, B. J., Defect chemistry and physical properties of transparent conducting oxides in the CdO—In$_2$O$_3$—SnO$_2$ system. *Thin Solid Films* 2002, 411, (1), 106-114.
50. Sheets, W. C.; Mugnier, E.; Barnabe, A.; Marks, T. J.; Poeppelmeier, K. R., Hydrothermal synthesis of delafosite-type oxides. *Chemistry of Materials* 2006, 18, (1), 7-20.
51. Jimenez, V. M.; Mejias, J. A.; Espinos, J. P.; GonzalezElipe, A. R., Interface effects for metal oxide thin films deposited on another metal oxide 0.2. SnO2 deposited on SiO2. *Surface Science* 1996, 366, (3), 545-555.
52. Hoflund, G. B.; Corallo, G. R., Electron-Energy-Loss Study of the Oxidation of Polycrystalline Tin. *Physical Review B* 1992, 46, (11), 7110-7120.
53. Bevolo, A. J.; Verhoeven, J. D.; Noack, M., A Leels and Auger Study of the Oxidation of Liquid and Solid Tin. *Surface Science* 1983, 134, (2), 499-528.
54. Fu, L. F.; Welz, S. J.; Browning, N. D.; Kurasawa, M.; McIntyre, P. C., Z-contrast and electron energy loss spectroscopy study of passive layer formation at ferroelectric PbTiO3/Pt interfaces. *Applied Physics Letters* 2005, 87, (26).
55. Li, Q.; Koo, K. M.; Lau, W. M.; Lee, P. F.; Dai, J. Y.; Hou, Z. F.; Gong, X. G., Effects of Al addition on the native defects in hafnia. *Applied Physics Letters* 2006, 88, (18).
56. Lin, X. W.; Wang, Y. Y.; Dravid, V. P.; Michalakos, P. M.; Kung, M. C., Valence States and Hybridization in Vanadium-Oxide Systems Investigated by Transmission Electron-Energy-Loss Spectroscopy. *Physical Review B* 1993, 47, (7), 3477-3481.
57. Bach, D.; Stormer, H.; Schneider, R.; Gerthsen, D.; Verbeeck, J., EELS investigations of different niobium oxide phases. *Microscopy and Microanalysis* 2006, 12, (5), 416-423.
58. Stemmer, S.; Sane, A.; Browning, N. D.; Mazanec, T. J., Characterization of oxygen-deficient SrCoO3-delta by electron energy-loss spectroscopy and Z-contrast imaging. *Solid State Ionics* 2000, 130, (1-2), 71-80.
59. Zhu, F. R.; Huan, C. H. A.; Zhang, K. R.; Wee, A. T. S., Investigation of annealing effects on indium tin oxide thin films by electron energy loss spectroscopy. *Thin Solid Films* 2000, 359, (2), 244-250.
60. Morikawa, H.; Kurata, H.; Fujita, M., On the grain boundary segregation of Sn in indium-tin-oxide thin films. *Journal of Electron Microscopy* 2000, 49, (1), 67-72.
61. Wang, X. F.; Li, Q.; Moreno, M. S., Effect of Al And Y incorporation on the structure of HfO$_2$. *Journal of Applied Physics* 2008, 104, (093529), 1-4.
62. Zhang, H.; Dravid, V. P., Transmission High-Energy Electron-Energy-Loss Spectrometry (EELS) Analysis of Hole Formation and Charge-Transfer in P-Type Doped Cuprate Superconductors. *Journal of the American Ceramic Society* 1993, 76, (5), 1143-1149.
63. Degroot, F. M. F.; Grioni, M.; Fuggle, J. C.; Ghijsen, J.; Sawatzky, G. A.; Petersen, H., Oxygen 1s X-Ray-Absorption Edges of Transition-Metal Oxides. *Physical Review B* 1989, 40, (8), 5715-5723.
64. Minami, T., Transparent and conductive multicomponent oxide films prepared by magnetron sputtering. *Journal of Vacuum Science & Technology A—Vacuum Surfaces and Films* 1999, 17, (4), 1765-1772.
65. Minami, T., New n-type transparent conducting oxides. *Mrs Bulletin* 2000, 25, (8), 38-44.
66. Wang, A. C.; Edleman, N. L.; Babcock, J. R.; Marks, T. J.; Lane, M. A.; Brazis, P. R.; Kannewurf, C. R., Growth, microstructure, charge transport and transparency of random polycrystalline and heteroepitaxial metalorganic chemical vapor deposition-derived gallium-indium-oxide thin films. *Journal of Materials Research* 2002, 17, (12), 3155-3162.
67. Phillips, J. M.; Kwo, J.; Thomas, G. A.; Carter, S. A.; Cava, R. J.; Hou, S. Y.; Krajewski, J. J.; Marshall, J. H.;

Peck, W. F.; Rapkine, D. H.; Vandover, R. B., Transparent Conducting Thin-Films of GaInO$_3$. *Applied Physics Letters* 1994, 65, (1), 115-117.
68. Bellingham, J. R.; Phillips, W. A.; Adkins, C. J., Electrical and Optical-Properties of Amorphous Indium Oxide. *Journal of Physics—Condensed Matter* 1990, 2, (28), 6207-6221.
69. Narushima, S.; Orita, M.; Hosono, H., Transparent conductive amorphous oxides: Electron-transport properties and electronic structure. *Glass Science and Technology* 2002, 75, 48-53.
70. Perkins, J. D.; van Hest, M.; Teplin, C. W.; Alleman, J. L.; Dabney, M. S.; Gedvilas, L. M.; Keyes, B. M.; To, B.; Ginley, D. S.; Taylor, M. P.; Readey, D. W., Amorphous transparent conducting oxides (TCOS) deposited at T<=100 degrees C. *Conference Record of the 2006 IEEE 4th World Conference on Photovoltaic Energy Conversion, Vols 1 and 2* 2006, 202-204.

What is claimed is:

1. A method of fabricating a nanowire, comprising the steps of:
   (a) positioning a substrate over a support structure such that a part of the substrate is not supported by the support structure and is suspended over the support structure;
   (b) depositing a semiconductor oxide film over the substrate;
   (c) depositing an indium oxide film, which is optically transparent and electrically insulating, over the semiconductor oxide film;
   (d) depositing an anti-charging film over the indium oxide film such that a layered structure is formed with the anti-charging film as the top layer;
   (e) focusing and projecting a beam of Ga ions onto the anti-charging film over a region corresponding to the suspended part of the substrate to implant Ga ions into the indium oxide film; and
   (f) immediately removing the top layer from the layered structure after step (e) such that a surface of the indium oxide film with at least one Ga-doped nanowire is exposed.

2. The method of claim 1, wherein the substrate comprises a SiN membrane.

3. The method of claim 1, wherein the semiconductor oxide film comprises a Si oxide film.

4. The method of claim 1, wherein the indium oxide film comprises an In$_2$O$_3$ film.

5. The method of claim 1, wherein the anti-charging film comprises an Au film.

6. The method of claim 1, wherein the thickness of the anti-charging film is less than that of any of the substrate, the semiconductor oxide film, and the indium oxide film.

7. The method of claim 1, wherein the step of focusing and projecting is performed with a dual beam FIB implantation.

8. The method of claim 7, wherein the step of focusing and projecting is performed with a beam of electrons simultaneously for imaging.

9. The method of claim 1, prior to the step (f), further comprising the step of repeating the step (e) a number of times until a desired pattern of a plurality of Ga ion nanowires is formed thereon the indium oxide film.

* * * * *